United States Patent [19]

Rho et al.

[11] Patent Number: 5,262,663
[45] Date of Patent: Nov. 16, 1993

[54] DRAM CELL HAVING TUNNEL SHAPED STRUCTURE AND FORMATION PROCESS THEREOF

[75] Inventors: Byungbyug Rho, Kyunggi; Daejei Jin, Seoul, both of Rep. of Korea

[73] Assignee: Samsung Electronics Co., Ltd., Rep. of Korea

[21] Appl. No.: 635,731

[22] Filed: Dec. 28, 1990

[30] Foreign Application Priority Data

Jan. 11, 1990 [KR] Rep. of Korea ............. 90-17706

[51] Int. Cl.5 ............... H01L 27/01; H01L 27/13; H01L 29/78
[52] U.S. Cl. .............................. 257/308; 257/296; 257/309; 257/368; 257/390; 257/401
[58] Field of Search ................. 357/23.6, 23.5; 257/295, 296, 297, 298, 299, 300, 306, 307, 308, 309, 310, 311, 312, 313

Primary Examiner—Andrew J. James
Assistant Examiner—Alice H. Wu

[57] ABSTRACT

A DRAM cell having a tunnel-shaped structure (in the form of buried bit line structure) and a formation process therefore are disclosed. A storage poly and a local connecting layer are interconnected in such a manner as to form a tunnel-shaped portion, and a bit line passes through the tunnel formed by the combination of the local connecting layer and the storage poly. A flattening insulating layer, a bit line capping-oxide-layer and a spacer are filled between the storage poly, the local connecting layer and the bit line. The storage poly is contacted through the local connecting layer to a first semiconductor region, while the bit line is directly contacted to a second semiconductor region.

9 Claims, 18 Drawing Sheets

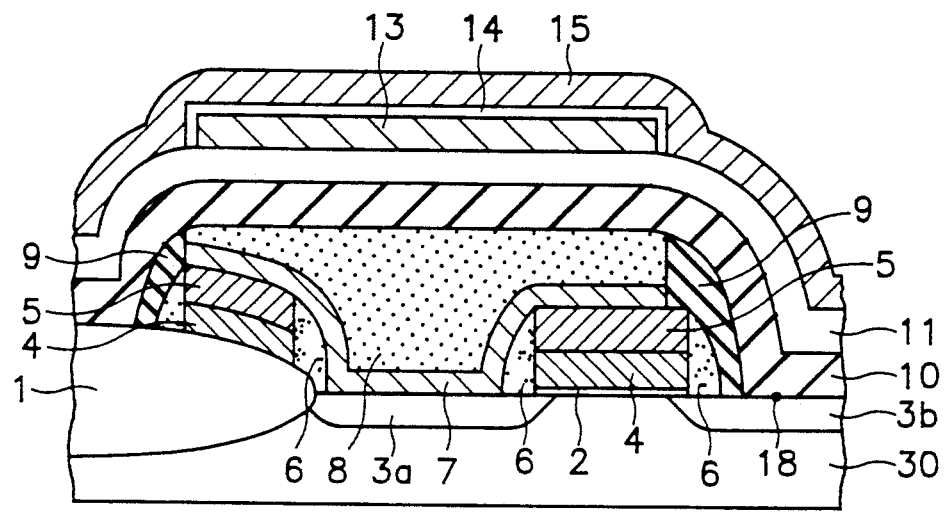

DRAM CELL HAVING TUNNEL SHAPED STRUCTURE AND FORMATION PROCESS THEREOF

BACKGROUND OF THE INVENTION (1) Field of the Invention

The present invention relates to a dynamic random access memory (DRAM) cell having a tunnel-shaped structure and a formation process thereof, and more particularly to a DRAM cell having a tunnel-shaped structure and a formation process thereof, in which the bit line is formed to pass between a local connecting layer and a storage polysilicon layer having a tunnel-shaped structure.

(2) Description of the Prior Art

It is desirable that the storage capacitance be kept constant because the more the density of DRAM cells increases, the more the are of each cell decreases. As a method for keeping the storage capacitances constant, a stacked type capacitor has been proposed.

SUMMARY OF THE INVENTION

The present invention is intended to overcome the disadvantages of the conventional DRAM cells.

It is an object of the present invention to provide a DRAM having a tunnel-shaped structure and a formation process thereof, in which a bit line passes between the tunnel-shaped storage polysilicon layer and a local connecting layer, and the projected portions formed on the conventional active region to connect the bit line to the active region are eliminated, thereby reducing the cell size and making the contours of the bit line, the active region and the word line straight.

In achieving the above object, a DRAM cell according to the present invention comprises: a first conductivity-type semiconductor substrate; a field-oxide-layer formed on the semiconductor substrate in order to define active region; first and second semiconductor regions of a second conductivity-type formed within said active region; an insulating layer formed on a channel area between said first and second semiconductor regions; a word line formed on said insulating layer; a word line capping-oxide-layer for capping said word line;

a first spacer formed on the side wall of the word line and the word line capping-oxide-layer; a local connecting layer surrounding the upper surface of the word line capping-oxide-layer and the inner first spacer contacted via a contact to the first semiconductor region; a flattening insulating layer formed on the local connecting layer;

a second spacer formed in such a manner as to surround the flattening insulating layer, a side of the local connecting layer and the outer first spacer; a bit line and a bit line capping-oxide-layer formed on the flattening insulating layer; a third spacer formed on the side walls of the bit line and the bit line capping-oxide-layer; storage polies formed upon the bit line capping-oxide-layer; a capacitor dielectric layer surrounding the storage polysilicon layers and the side wall of the local connecting layer; and a plate electrode surrounding the storage polysilicon layers and the capacitor dielectric layer.

The formation process for the DRAM cell according to a preferred embodiment of the present invention comprises: forming a field-oxide-layer on a semiconductor substrate; forming an insulating layer, a bit line and, a bit line capping oxide-layer; forming conductivity-type first and second semiconductor regions; forming a first spacer by carrying out an etch-back after forming an oxide layer on the whole surface of the substrate; forming a thin local connecting layer after forming the first spacer; depositing an insulating layer on the local connecting layer, reflowing the insulating layer to flatten, and patterning the local connecting layer and the insulating layer; forming a second spacer by carrying out an etch-back after forming an oxide layer on the flattened pattern; patterning the bit line and the bit line capping-oxide-layer after stacking; forming a third spacer and exposing the local connecting layer at the same time by carrying out an etch-back after stacking an oxide layer on the patterns of the bit line and the bit line capping-oxide-layer; forming the storage polysilicon layer by stacking polysilicon layers and patterning them; forming a capacitor dielectric layer on the storage polysilicon layers; and forming a plate electrode by stacking a polysilicon layer on the capacitor dielectric layer.

The DRAM cell according to the present invention comprises: a first conductivity-type semiconductor substrate; a field-oxide-layer formed on the semiconductor substrate in order to define an active region; first and second semiconductor regions of a second conductivity-type formed on said active region; an insulating layer formed on a channel area between said first and said second semiconductor region; a word line formed on said insulating layer and a word line capping-oxide-layer; a first spacer formed on the side walls of the word line and the word line capping-oxide-layer; a local connecting layer surrounding the upper surface of the word line capping-oxide-layer and the inner first spacer, and contacting the first semiconductor region through a contact; a flattening insulating layer formed on the local connecting layer; a second spacer surrounding the outer first spacer, the flattening insulating layer and the side walls of the local connecting layer a bit line and a bit line capping-oxide-layer formed on the flattening insulating layer; a third spacer formed on the side walls of the bit line, the bit line capping-oxide-layer, the plate electrode, and the capacitor dielectric layer; storage polysilicon layer formed on the bit line capping-oxide-layer; a capacitor dielectric layer surrounding the whole surface of the storage polysilicon layers, and also surrounding the side wall of the local connecting layer; and plate electrodes surrounding the whole surface of the capacitor dielectric layer, and formed respectively upon and under the storage polysilicon layers.

The formation process according to the present invention comprises: forming a field-oxide-layer on a first conductivity-type semiconductor substrate; forming an insulating layer, a bit line, a bit line capping-oxide-layer; forming first and second semiconductor regions of a second conductivity type; forming a first spacer by carrying out an etch-back after forming an oxide layer on the whole surface of the substrate; forming a thin local connecting layer after forming the first spacer; depositing an insulating layer on the local connecting layer and after flattening it by carrying out a reflowing and patterning the local connecting layer and the insulating layer; forming a second spacer by carrying out an etch-back after forming an oxide layer on the flattened pattern; patterning a bit line, a bit line capping-oxide-layer, and a heterogeneous material after stacking them; forming a third spacer by carrying out an etch-back after stacking an oxide layer on the patterns of the bit line, the bit line capping-oxide-layer and the heterogeneous material and exposing the local connecting layer; patterning the storage polysilicon layers and the local connecting layer after forming a storage polysilicon layer by stacking a polysilicon layer; step of removing the heterogeneous material formed between the storage polysilicon layer and the bit line capping-oxide-layer by carrying out an under-etching; forming a capacitor dielectric layer; and forming a plate electrode upon and under the storage polysilicon layer by stacking polysilicon layers.

BRIEF DESCRIPTION OF THE DRAWINGS

The above object and other advantages of the present invention will become more apparent by the following description of the preferred embodiment of the present invention with reference to the attached drawings in which:

FIG. 2C is a side view of the assembled components shown in FIG. 2B.

DESCRIPTION OF THE PREFERRED EMBODIMENT

Figure 1:
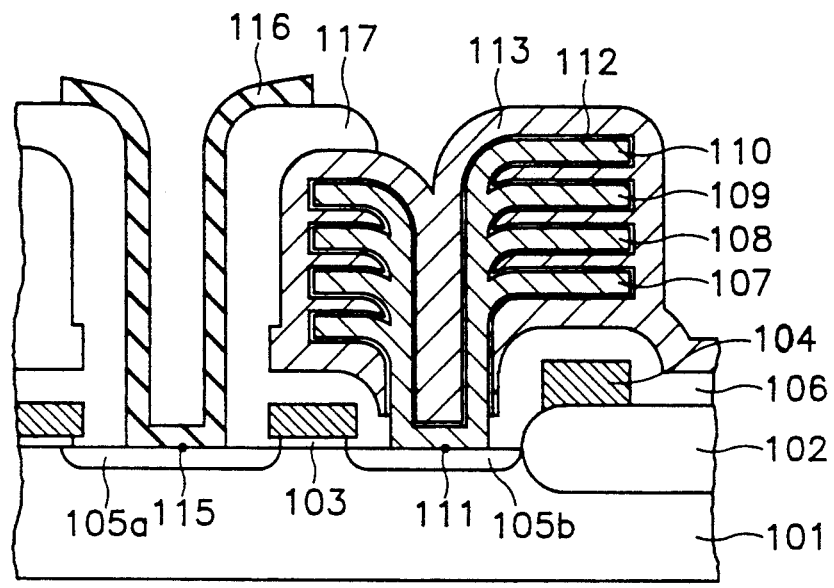
FIG. 1 is a vertical sectional view of the conventional DRAM cell.

FIG. 1 is a vertical sectional view of a conventional DRAM cell. As shown in this drawing, the conventional DRAM cell is manufactured in such a manner that: a field-oxide-layer 102, semiconductor region 105a, 105b, a first insulating layer 103 and a word line 104 on said oxide layer 102 are formed upon a substrate 101 whereby a transistor is formed; then a second insulating layer 106, storage polysilicon layers 107–110 (sometimes referred to herein as "polies"), a capacitor dielectric layer 112 wrapping the said storage polies 107–110, and plate polysilicon layers 113 as opposingly facing electrode are successively formed whereby a fin-shaped stack capacitor is formed; and then, a third insulating layer 117 and a bit line 116 are successively formed.

The above-described DRAM cell has four fin-shaped portions, and the final storage polysilicon layer ("poly") 110 is connected to the second semiconductor region 105b through a contact 111, while the bit line 116 is connected to the first semiconductor region 105a through a contact 115.

However, in this conventional DRAM cell, where the bit line 116 is connected to the first semiconductor region 105a which is formed on the substrate 101, the contact 115 and the bit line 116 are formed after forming the plate poly 113 of the capacitor and the third insulating layer 117, so that the height difference from the first semiconductor region 105a to the bit line 116 is relatively large. Therefore, it is difficult to connect the bit line 116 to the first semiconductor region 105a, and the area of the cell is increased because the margin of the contact 115 has to be secured sufficiently in order to effect a contact between the bit line 116 and the first semiconductor region 105a.

Further, contact 111 is formed in order to form a contraction between the storage poly and the second semiconductor region 105b before forming the storage poly 110, and therefore, the areas of the respective storage polies 107 to 110 are decreased according to an increase of the size of the contact, thereby ultimately decreasing the storage capacitance.

Figure 2B:
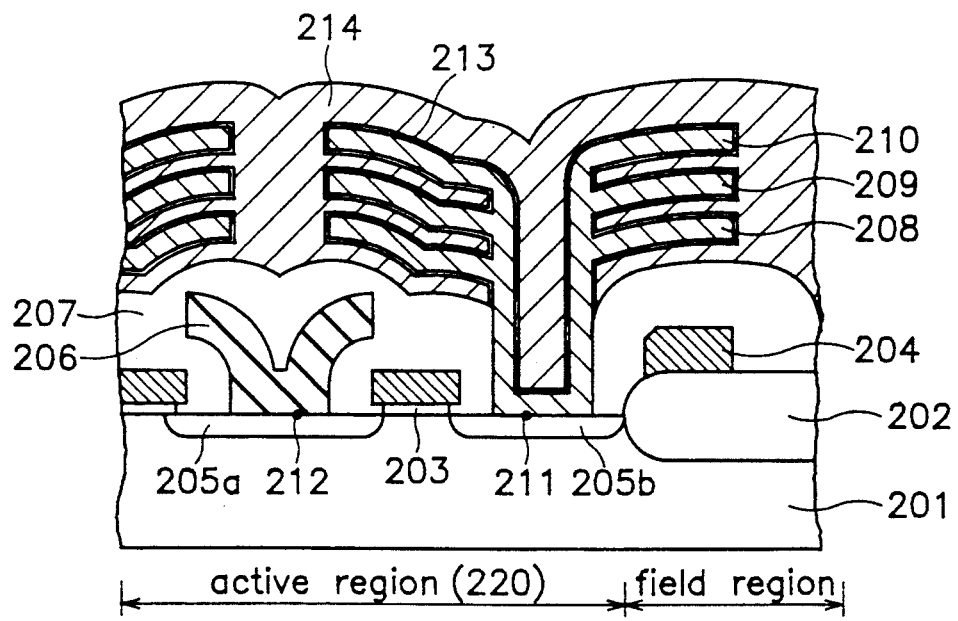
FIG. 2B is a vertical sectional view and FIG. 2A is a layout of another conventional DRAM cell improving upon that of FIG. 1.
Figure 2A:
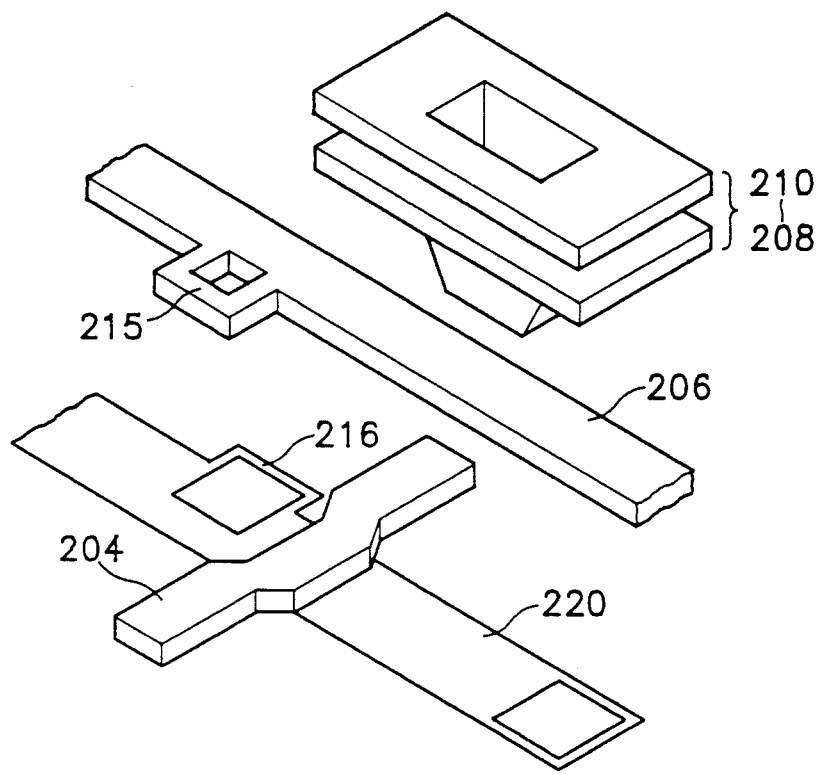
Figure 2A:
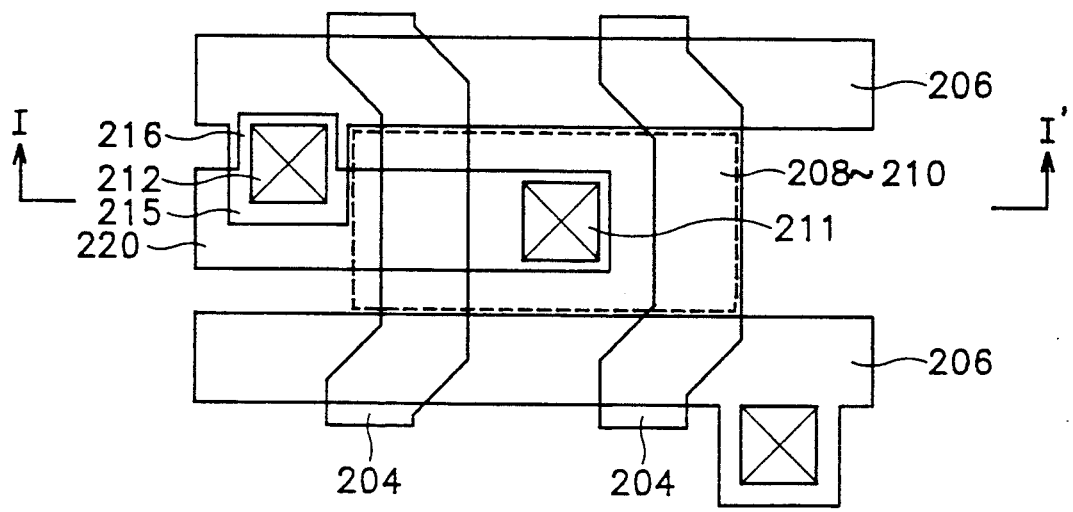

In order to solve the above described problem, another type is proposed as shown in FIGS. 2A and 2B in which the bit line is formed before forming the capacitor.

FIG. 2A illustrates the layout of the DRAM cell, and FIG. 2B is a sectional view taken along the line 2A—2A' of FIG. 2A. The DRAM cell of FIGS. 2B and 2C is manufactured in such a manner that: a field-oxide-layer 202, a first insulating layer 203, a word line 204, and first and second semiconductor regions 205a, 205b are formed upon a semiconductor substrate 201, respectively, thereby forming a transistor; and a bit line 206, a second insulating layer 207, storage polies 208, 209 and 210, capacitor dielectric layer 213, and a plate electrode 214 are successively formed, thereby forming a capacitor.

Unlike the DRAM cell of FIG. 1, the above-described DRAM cell forms a bit line before forming the capacitor, and has a buried bit line structure in which the bit line 206 passes under the storage polies 208 to 210. Further, referring to FIG. 2A (the expanded view), the bit line 206 passes around an active region 220. The DRAM cell of FIGS. 2A and 2B, like the DRAM cell of FIG. 1, forms the contact 211 for contacting the storage polies and the second semiconductor region 205b before forming the final storage poly 210. Thus, some problems as described above in connection with FIG. 1 remain in that the areas of the respective storage polies are decreased according to the increase of the size of the contact, resulting in the ultimate reduction of the storage capacitance.

Figure 3A:
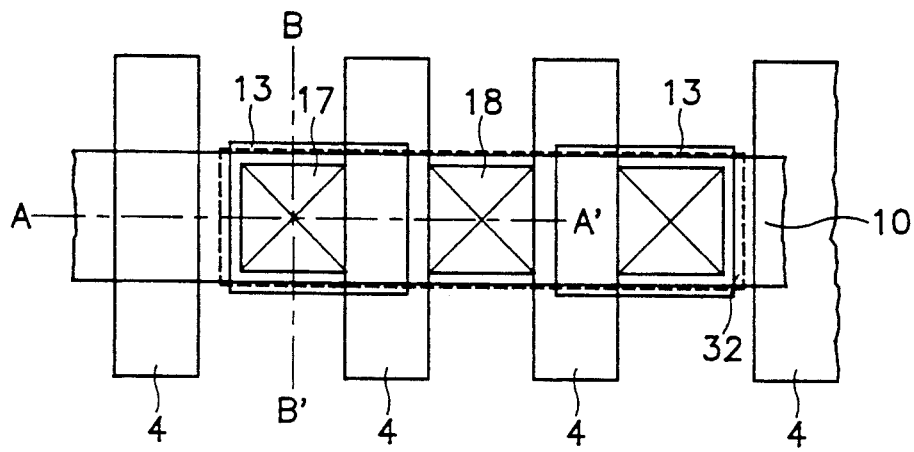
FIG. 3A is a layout and FIGS. 3B, 3C are vertical sectional views of the DRAM cell according to the present invention.
Figure 3B:
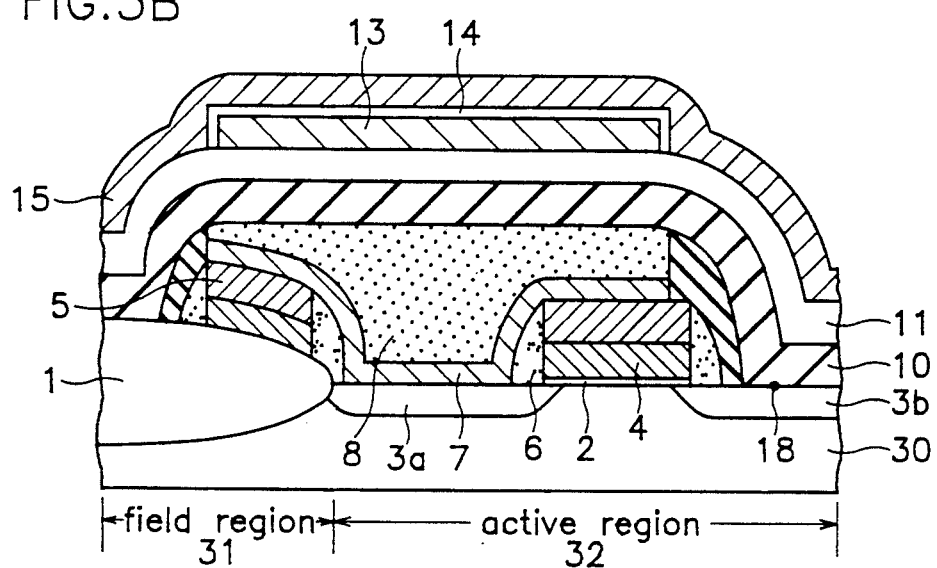
Figure 3C:
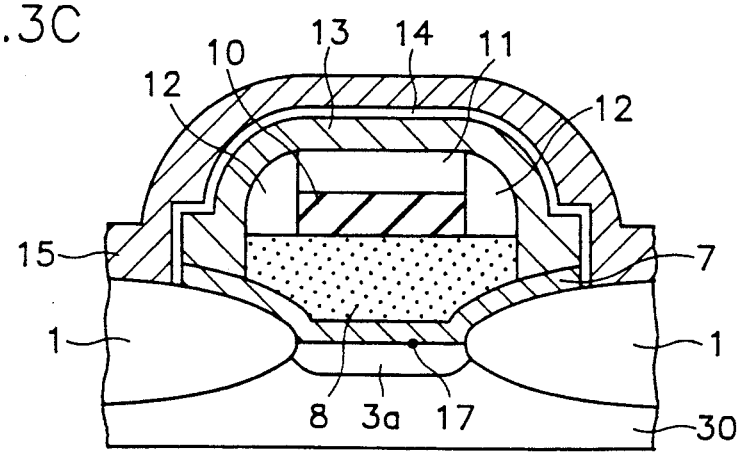

FIGS. 3A, 3B and 3C illustrate a first embodiment of the DRAM cell according to the present invention. FIG. 3A is a layout of the DRAM cell according to the present invention, and FIGS. 3B and 3C being, respectively, 2 sectional views taken along the lines A—A' and B-B' of FIG. 3A.

The DRAM cell according to the present invention comprises: a first conductivity-type semiconductor substrate 30; a field-oxide-layer formed on the semiconductor substrate 30; and insulating layer 2 formed on an active region 32 of the semiconductor substrate 30; first and second semiconductor regions 3a, 3b of a second conductivity type; a word line 4; a word line capping-oxide-layer 5; a first spacer 6 formed on the side walls of the word line 4 and the word line capping-oxide-layer 5; a local connecting layer 7 contacting through a contact 17 the semiconductor region 3a, and simultaneously surrounding the first spacer 6 the upper surface and the side of the word line capping-oxide-layer 5; a flattening insulating layer 8 formed on the local connecting layer 7; a second spacer 9 formed in such a manner as to surround the outer first spacer 6 and the side of the local connecting layer 7; a bit line 10 and a bit line capping-oxide-layer 11 formed on the flattening insulating layer 8; a third spacer 12 formed on the side walls of the bit line 10 and the bit line capping oxide layer 11; a storage poly 13 having a tunnel-shaped structure and contacting the local connecting layer 7; a capacitor dielectric layer 14 surrounding the storage poly 13 and the side wall of the local connecting layer 7; and plate electrode 15 as an opposingly facing electrode surrounding the storage poly 13 and the capacitor dielectric layer 14.

As shown in FIG. 3C, the DRAM cell according to the present invention is a tunnel-shaped structure, with the local connecting layer 7 and the storage poly 13 being contacted to each other. It is constituted such that: the bit line 10 passes under the storage poly 13, and through the tunnel formed between the storage poly 13 and the local connecting layer 7; the flattening insulating layer 8, the bit line capping-oxide-layer and the third spacer 12 are filled between the storage poly 13, the local connecting layer 7 and the bit line 10.

Referring to FIG. 3B the word line 4 formed on the active region 32 is sandwiched between the insulating layer 2 and the bit line cap 5, while the word line 4 sandwiched between the field region 31 is formed on the field-oxide-layer 1 and the bit line capping oxide layer 5.

Referring to FIG. 3A, it is seen that the shapes of the active region 32, the bit line 10 and the word line 4 are formed in a straight line unlike those of FIG. 2B.

Referring to FIGS. 3B and 3C, the storage poly 13 is connected to the local connecting layer 7, and contacts, through a contact 17, the first semiconductor region 3a, while the bit line 10 contacts the second semiconductor region 3b through a contact 18.

FIGS. 4A to 14B illustrate the manufacturing process for the DRAM cell according to the first embodiment of the present invention. FIGS. 4A to 14A being sectional views taken along the line A-A' of FIG. 3A, and FIGS. 4B to 14B being sectional views taken along the line B—B' of FIG. 3B.

Figure 4A:
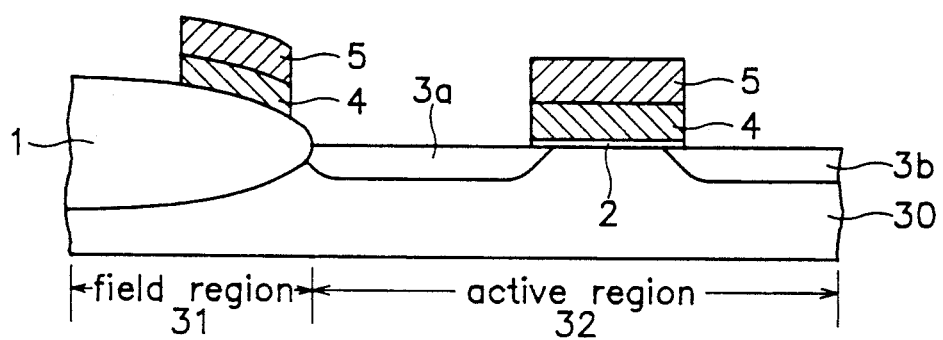
FIGS. 4A to 4B illustrate an embodiment of the manufacturing process for the DRAM cell according to the present invention.
Figure 4B:
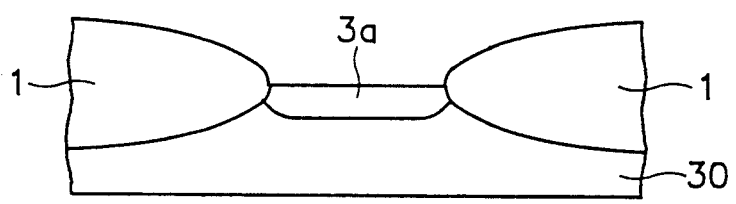

Referring to FIGS. 4A and 4B, on the semiconductor substrate 30 on which the field-oxide-layer 1 is formed, there are stacked a word line 4 and a word line capping-oxide-layer 5; successively, and then, a patterning is carried out. Under this condition, the word line 4 and the word line capping-oxide-layer 5 are sequentially formed on the field-oxide-layer 1 within the field region 31, while, within the active region 32 on the substrate, there are sequentially formed an insulating layer 2, a word line 4 and a word line capping-oxide-layer 5. Impurities are then doped into the active region 32 of the second conductivity type, thereby forming semiconductor regions 3a and 3b.

Figure 5A:
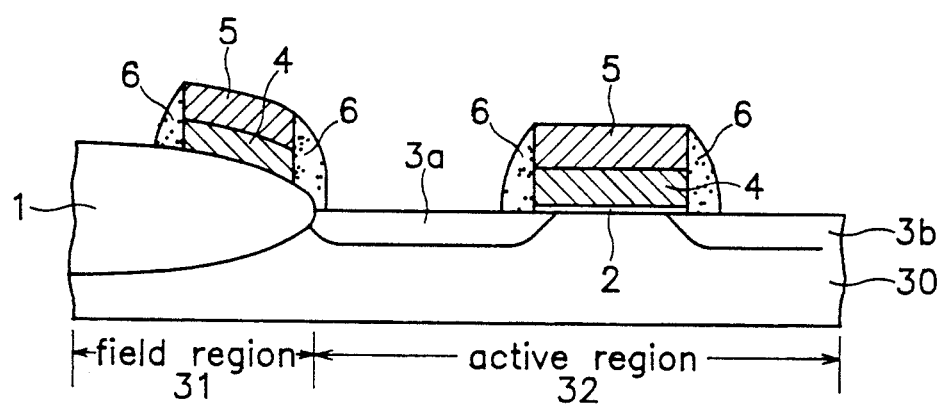
Figure 5B:
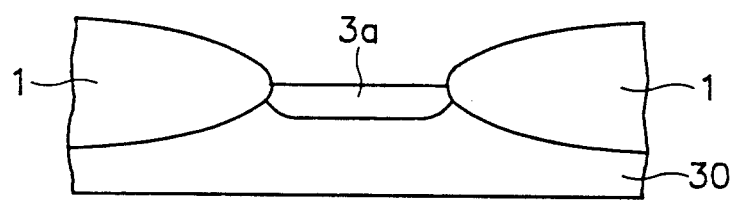

Referring to FIGS. 5A and 5B, an oxide layer is formed on the whole surface of the substrate by applying a chemical vapor deposition (CVD) method, and an etch-back is carried out so that the first spacer 6 should be formed on the side walls of the word line 4 and the word line capping-oxide-layer 5. Under this condition, the semiconductor regions 3a and 3b are opened, so that they should be directly connected to the local connecting layer and the bit line to be formed in the succeeding steps.

Figure 6A:
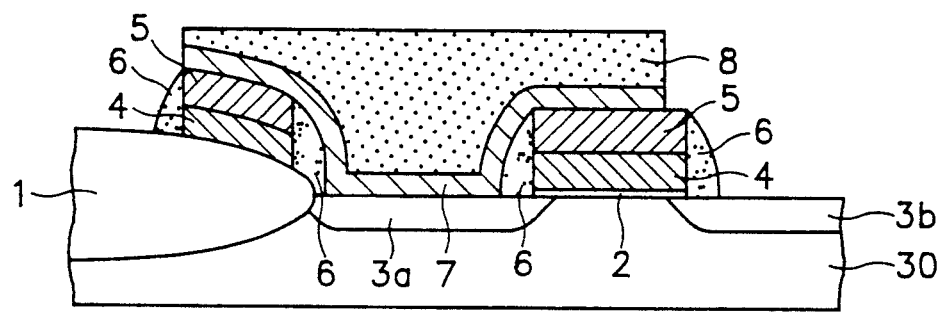
Figure 6B:
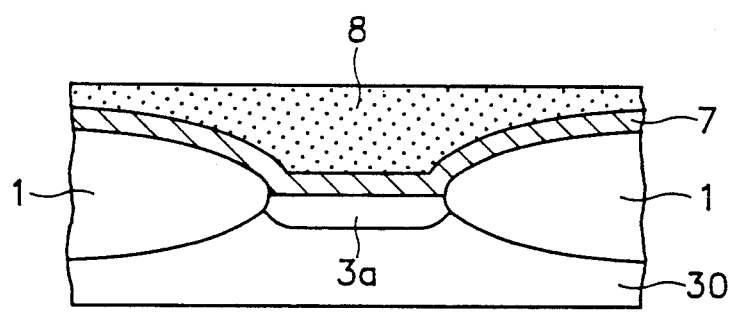

Referring to FIGS. 6A and 6B, a polysilicon layer is deposited to form the local connecting layer 7 after forming the first spacer 6, and thereupon, a BPSG (boron phosphorus silica glass) layer 8 is deposited. Then, a reflow is carried out to perform flattening, and then patterning is carried out.

Figure 7A:
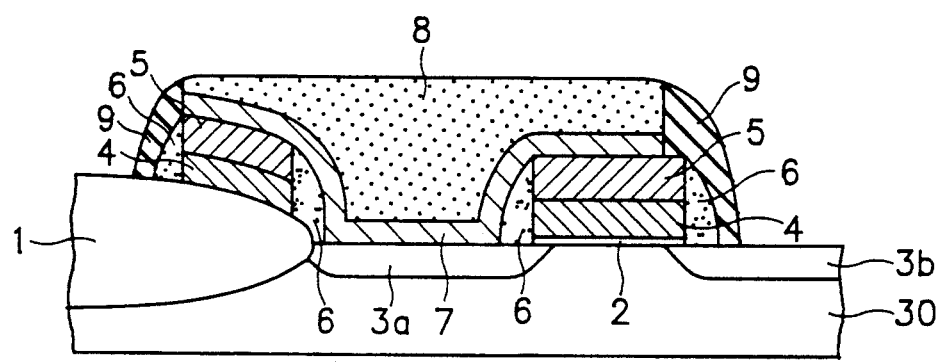
Figure 7B:
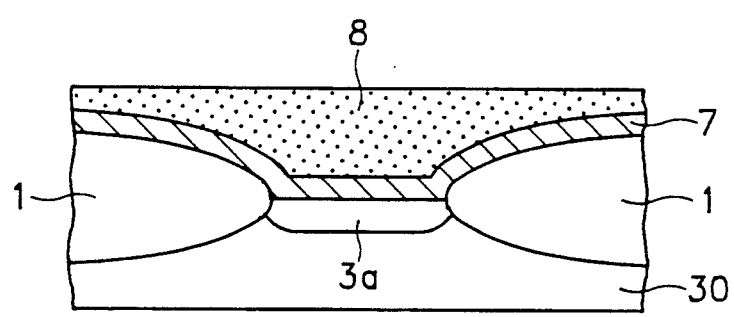

Referring to FIGS. 7A and 7B, upon the oxide layer which is formed on the whole surface of the pattern as described above, an etch-back is carried out, thereby forming a second spacer 9.

FIGS. 6A to 7B are different from FIG. 7A and FIG. 6A in that the second spacer 9 is formed thereto, while FIG. 7B which is a sectional view taken along the line B—B' of FIG. 3A has the same structure as that of FIG. 6B.

Figure 8A:
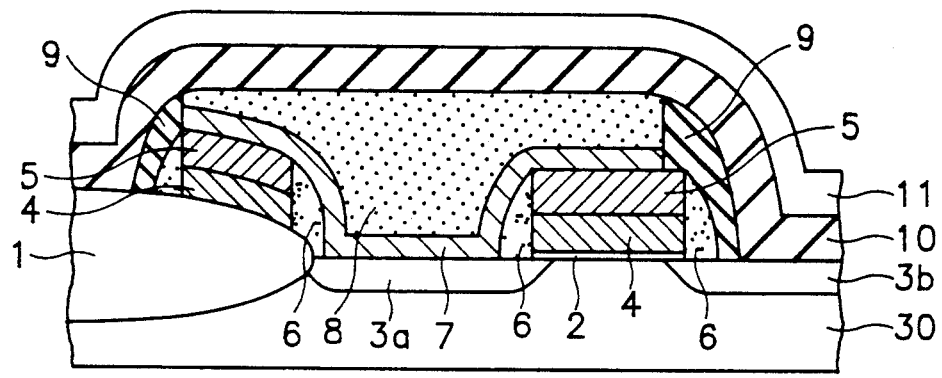
Figure 8B:
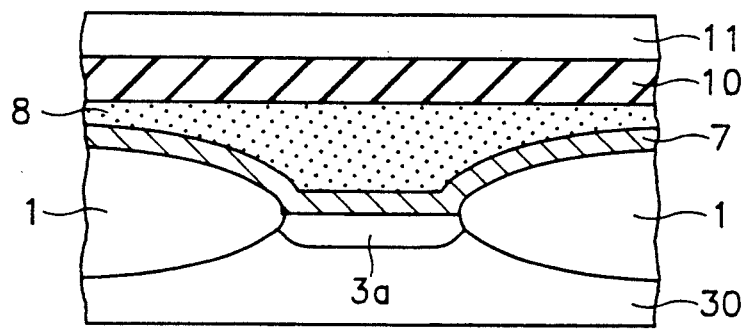
Figure 9A:
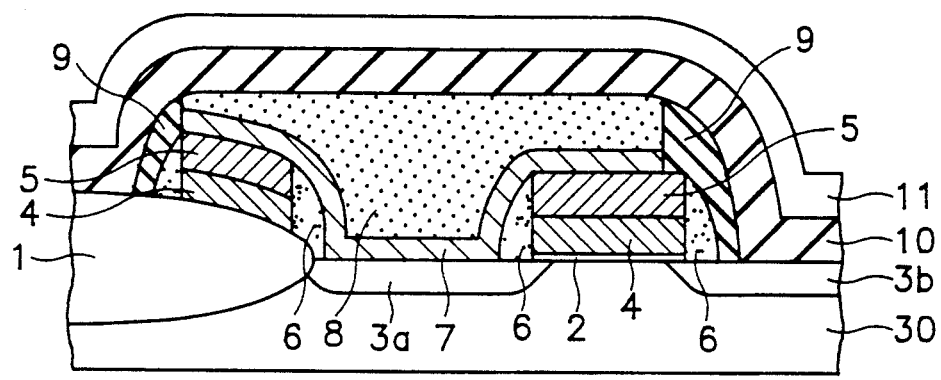
Figure 9B:
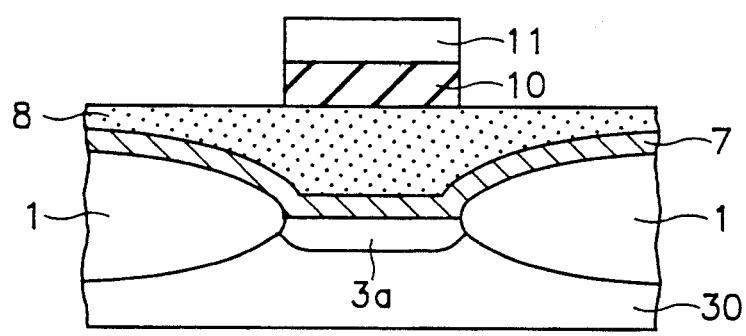
Figure 10A:
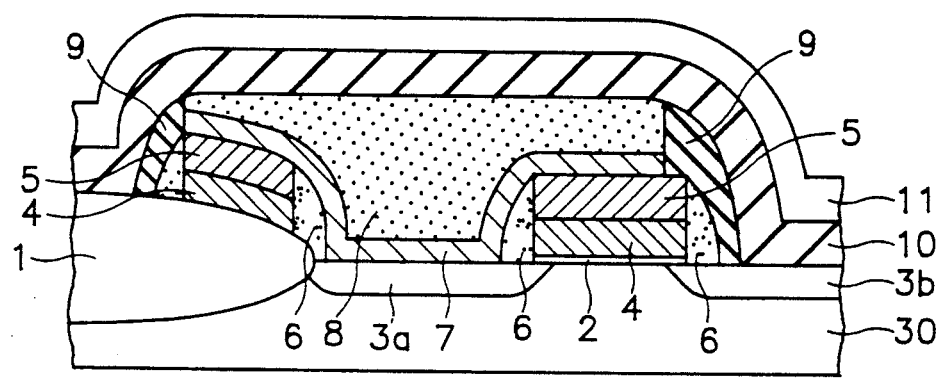
Figure 10B:
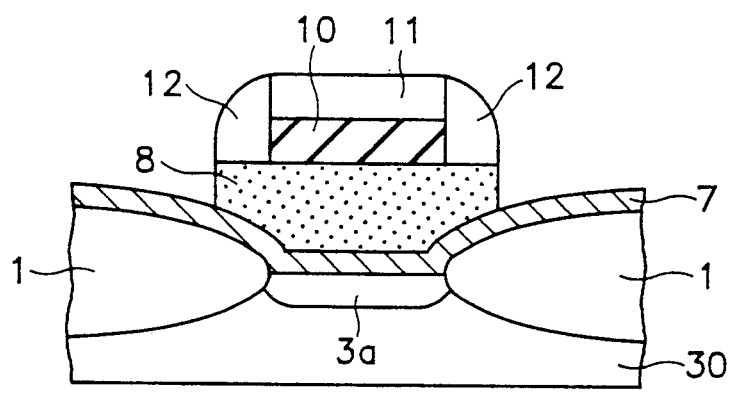

Referring to FIGS. 8A to 10B, the bit line and the bit line capping-oxide-layer are patterned, and a spacer is formed on the side walls of the bit the bit line capping-oxide-layer. First, as shown in FIGS. 8A and 8B, the bit line 10 and the bit line capping-oxide-layer 11 are successively formed and then, the patterning is carried out as shown in FIGS. 9A and 9B. Afterward, an oxide layer is formed on the whole surface of the pattern and, by carrying out an etch-back, the third spacer 12 is formed on the side walls of the bit line and the bit line capping-oxide-layer 11 as shown in FIGS. 10A and 10B. During the etch-back process for forming the third spacer by etching the BPSG layer 8 which is a flattening insulating layer, a part of the local connecting layer 7 is exposed.

Referring to FIGS. 8A to 10B, in the process of forming the third spacer 12 after forming the bit line 10 and the bit line capping-oxide-layer 11, there is no change in FIGS. 8A to 10A which are sectional views taken along the line A—A' of FIG. 3A. However, in FIGS. 8B to 10B which are sectional views taken along the line B—B' of FIG. 3A, changes occur in the order of the manufacturing steps.

FIG. 8B is a sectional view showing the state after stacking the bit line 10 and the bit line capping-oxide-layer 11, and FIG. 9B is a sectional view showing the state after patterning of the bit line 10 and the bit line capping-oxide-layer 11, while FIG. 10B is a sectional view showing the state after forming the third spacer 12 on the side walls of the bit line 10 and the bit line capping-oxide layer 11.

Figure 11A:
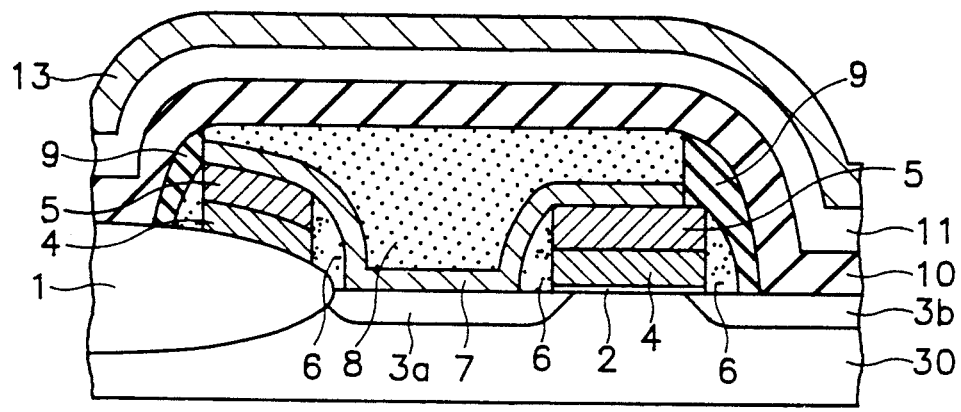
Figure 11B:
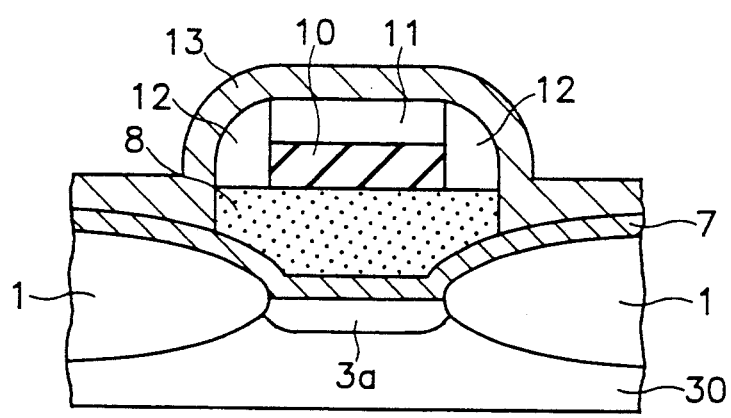
Figure 12A:
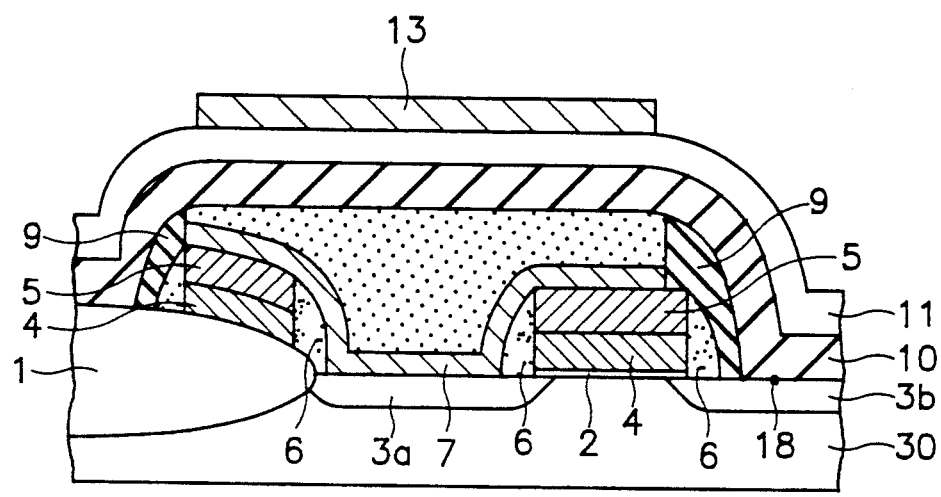
Figure 12B:
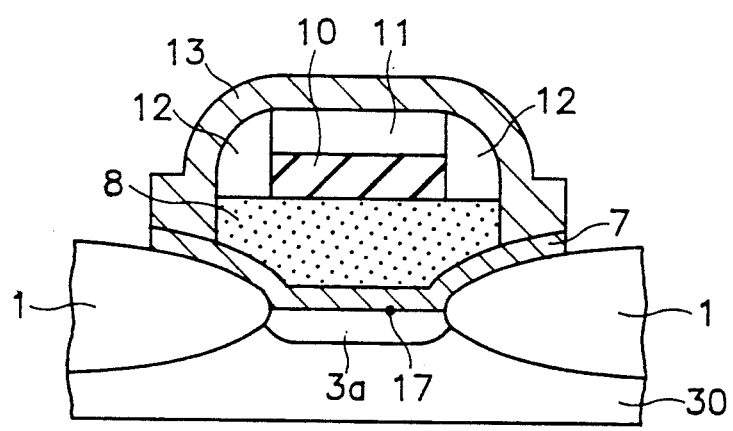

FIGS. 11A to 12B illustrate the steps of forming the storage poly and, as shown in FIGS. 11A and 11B, the storage poly 13 is formed by depositing a polysilicon layer upon the pattern of the third spacer 12, while, as shown in FIGS. 12A and 12B, the storage poly 13 and the local connecting layer 7 are patterned.

Referring further to FIGS. 11A to 12B, the local connecting layer 7 and the storage poly 13 are interconnected in such a manner as to form a tunnel, and the bit line 10 passes through the tunnel formed by the combination of the local connecting layer 7 and the storage poly 13, while the flattening insulating layer 8, the bit line capping-oxide-layer 11 and the third spacer 12 are filled between the local connecting layer 7, the storage poly 13 and the bit line 10. Further, the storage poly 13 is contacted through the local connecting layer 7 and the contact 17 to the first semiconductor region 3a, while the bit line 10 is contacted through the contact 18 to the second semiconductor region 3b.

Figure 13A:
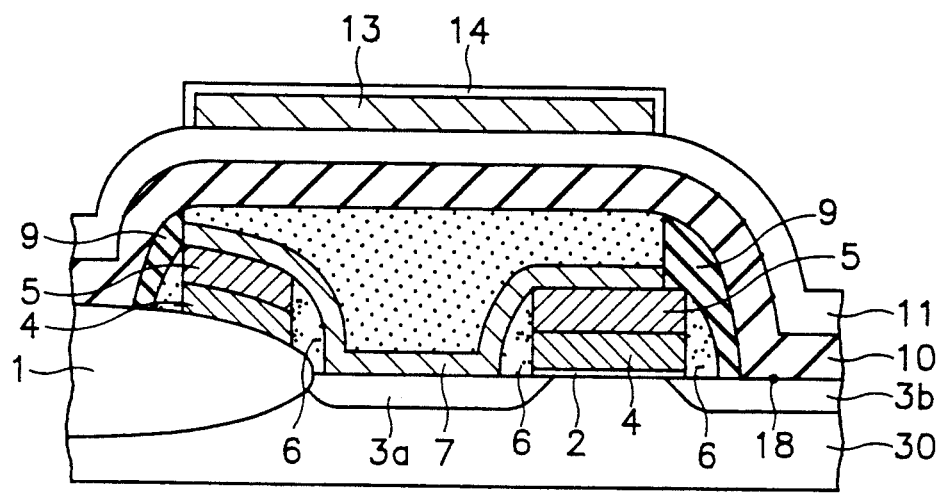
Figure 13B:
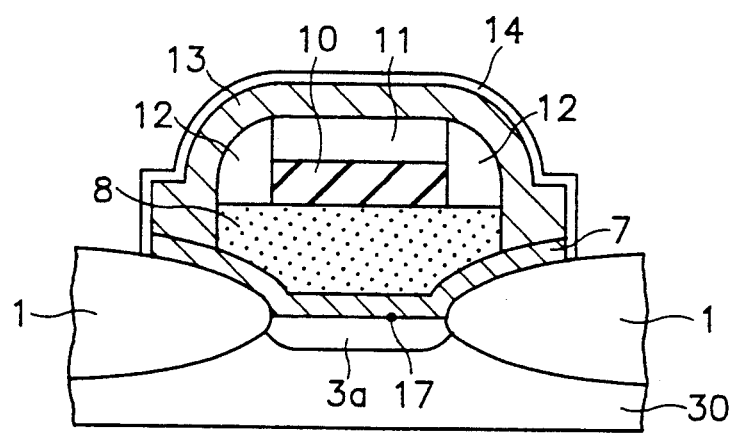

Referring to FIGS. 13A and 13B, the capacitor dielectric layer 14 is formed by oxidizing exposed storage poly 13 and the exposed local connecting layer 7. Under this condition, instead of the oxide layer being the capacitor dielectric layer, an ONO insulating layer in the form of oxide layer/nitride layer/oxide layer can be used by forming a nitride layer and an oxide layer upon the oxide layer 14.

Referring to FIGS. 14A and 14B, the plate electrode 15 as opposingly facing electrodes are formed by depositing a polysilicon layer upon the pattern of the capacitor dielectric layer 14, thereby completing the formation of the DRAM cell according to the present invention.

FIGS. 15A to 18B illustrate the manufacturing process for the DRAM cell according to a second embodiment of the present invention, and this second embodiment of the present invention will be described in detail by reference to FIGS. 15A to 18B.

In the second embodiment of the present invention, the manufacturing steps up to the formation of the flattening insulating layer 8 and the second spacer 9 are the same as the first embodiment of the present invention (FIGS. 4A to 9B).

Figure 15A:
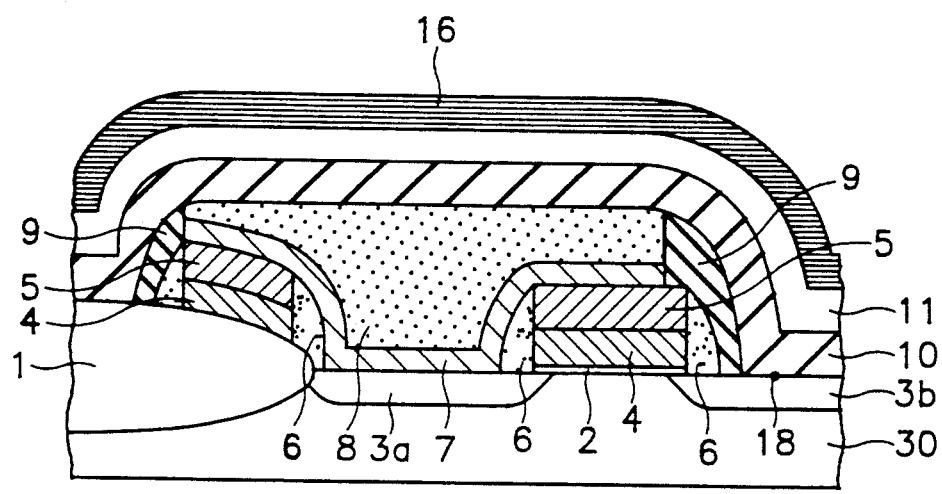
FIGS. 15A to 18B illustrate another embodiment of the manufacturing process for the DRAM cell of the present invention.
Figure 15B:
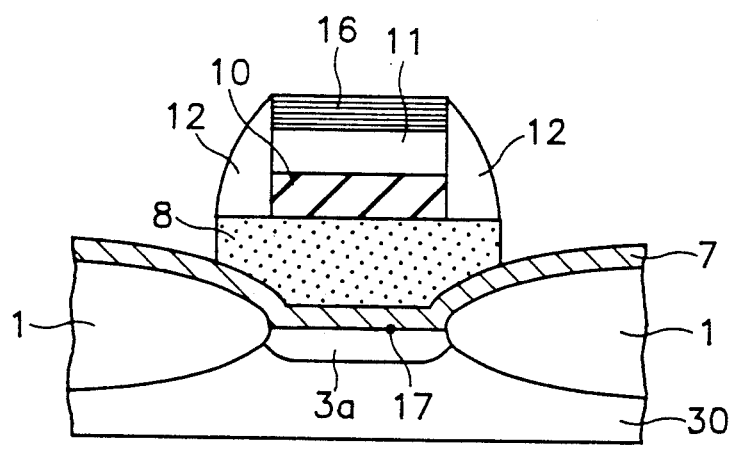

The flattening insulating layer 8 and the second spacer 9 are formed as shown in FIGS. 9A and 9B, and thereafter, a bit line 10, a bit line capping-oxide-layer 11 are stacked as shown in FIGS. 15A and 15B. A heterogeneous material 16, such as a nitride layer, is deposited as shown in FIGS. 15A and 15B, and then, a patterning is carried out. An oxide layer is formed on the whole surface of the substrate, and an etch-back is carried out, to form a third spacer 12 on the side walls of the bit line 10, the bit line capping-oxide-layer 11 and the heterogeneous material 16. When the third spacer 12 is formed by subjecting the oxide layer to an etch-back, the flattening insulating layer 8 is also partly etched so as to expose the local connecting layer 7.

Figure 16A:
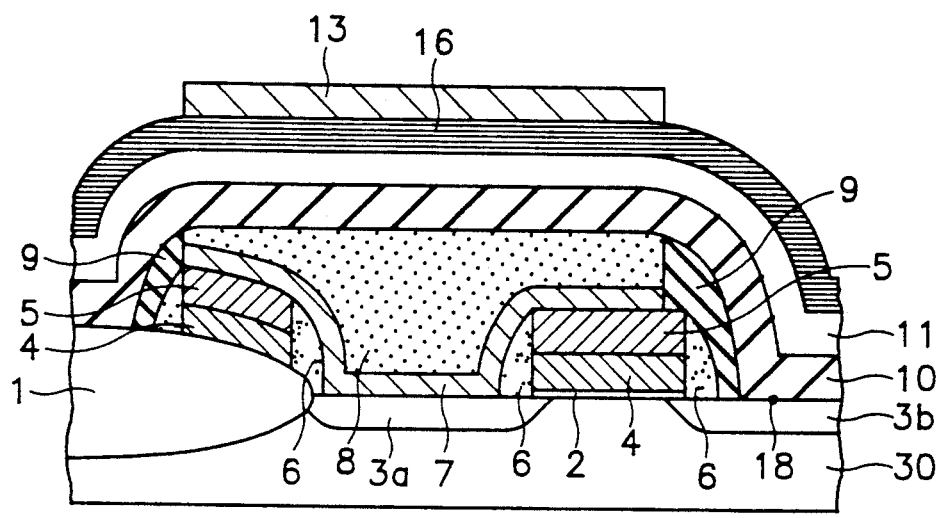
Figure 16B:
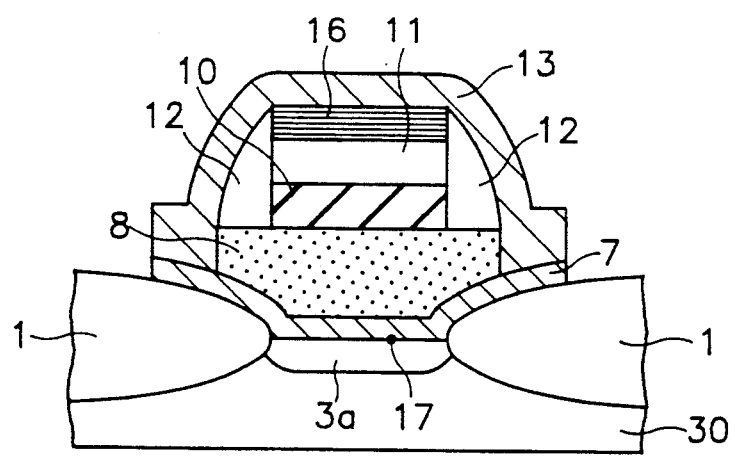
Figure 17A:
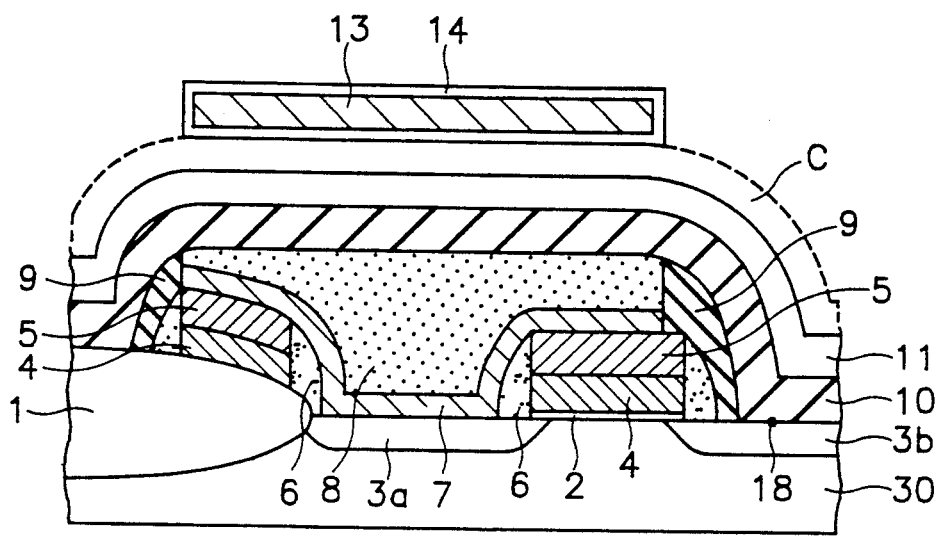
Figure 17B:
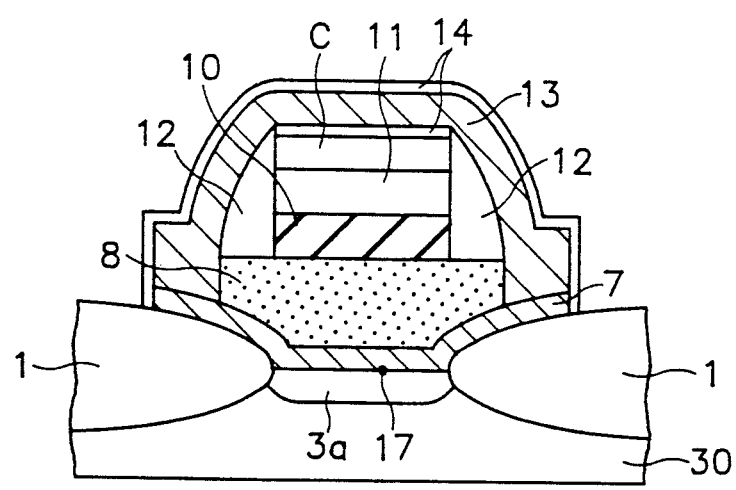

Referring to FIGS. 16A and 16B, a polysilicon layer is deposited on the whole surface of the substrate to form a storage poly 13, and then the local connecting layer 7 and the storage poly 13 are patterned. Referring to FIGS. 17A and 17B, after patterning the storage poly 13 and local connecting layer 7, and under-etching is carried out in such a manner that the heterogeneous material 16 formed between the storage poly 13 and the bit line capping-oxide-layer 11 is removed.

A capacitor dielectric layer 14 is formed by oxidizing the storage poly 13 and the local connecting layer 7. The capacitor dielectric layer can take the form of an ONO insulating layer instead of the simple oxide layer as in the case of the first embodiment.

In comparison with FIGS. 13 and 17, the heterogeneous material 16 is removed, and the lower portion of the storage poly 13 is exposed in FIG. 17. Therefore, it is seen that the capacitor dielectric layer 14 surrounds the storage poly 13. In the drawing, reference code C indicates the portion where the heterogeneous material 16 is etched off.

Figure 18A:
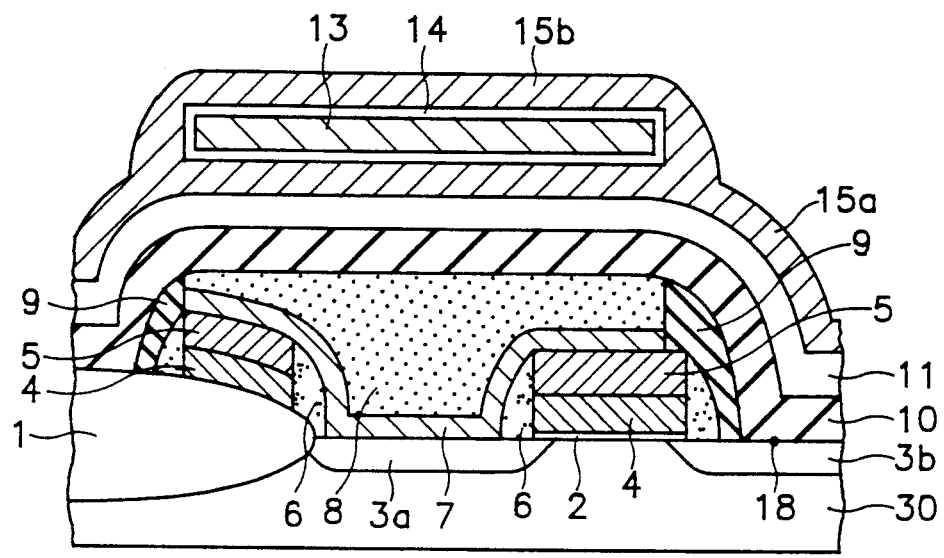

Referring to FIGS. 18A ad 18B, if the plate electrodes in the form of opposingly facing electrodes are formed by depositing a polysilicon layer, the polysilicon layer is deposited also on the portion C where the heterogeneous material 16 is removed, so that the plate electrodes 15a and 15b should be formed upon and under the storage poly 13.

Figure 18B:
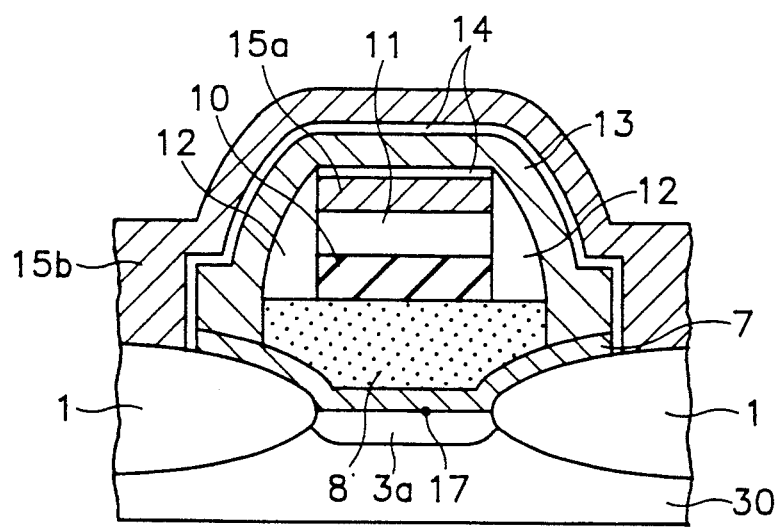

Referring to FIGS. 18A and 18B, the storage poly 13 and the local connecting layer 7 are interconnected in such a manner as to form a tunnel, and the bit line 10 and the lower plate electrode 15a pass through the tunnel. Therefore, the thin capacitor dielectric layer 14 is formed between the lower plate electrode 15a and the storage poly 13, while the flattening insulating layer 8, the bit line capping-oxide-layer 11 and the third spacer 12 fill the rest of the space.

According to the present invention as described above, the bit line is allowed to pass under the storage poly, so that the bit line and the active region can be formed in a straight line. Further, the projected portions which are conventionally provided in order to connect the bit line to the active region are eliminated, thereby making it possible to reduce the area of the cell.

What is claimed is:

1. A dynamic random access memory cell having a tunnel-shaped structure, comprising:
   a semiconductor substrate of a first conductivity type;
   a field-oxide-layer formed on said semiconductor substrate in order to define an active region;
   first and second semiconductor regions of a second conductivity type formed within said active region;
   an insulating layer formed on a channel area between said first and said second semiconductor regions;
   a word line having side walls formed on said insulating layer;
   a word line capping-oxide layer for capping said word line, a first spacer formed on the side walls of said word line and said word line capping-oxide-layer, said capping layer having an upper portion;
   a local connecting layer surrounding the upper portion of said word line capping-oxide-layer and said first spacer, and contacted through a first contact to said first semiconductor region;
   a flattening insulating layer formed on said local connecting layer;
   a second spacer surrounding said flattening insulating layer, the side walls of said local connecting layer, and said first spacer;
   a bit line and a bit line capping-oxide-layer formed on said flattening insulating layer;
   a third spacer formed on the side walls of said bit line and said bit line capping-oxide-layer;
   a storage polysilicon formed upon said bit line capping-oxide layer;
   a capacitor dielectric layer surrounding a portion of the surface of said storage polysilicon and the side walls of said local connecting layer; and
   a plate electrode surrounding said storage polysilicon and said capacitor dielectric layer.

2. The dynamic random access memory cell as claimed in claim 1, wherein said bit line passes through a tunnel formed by said local connecting layer and said storage polysilicon.

3. The dynamic random access memory cell as claimed in claim 1, wherein said flattening insulating layer, said bit line capping-oxide-layer and said third spacer are filled between said storage polysilicon, said local connecting layer and said bit line.

4. The dynamic random access memory cell as claimed in claim 1, wherein said storage polysilicon is contacted through said local connecting layer to said first semiconductor region by said first contact.

5. The dynamic random access memory cell as claimed in claim 1, wherein said bit line is contacted through a second contact to said second semiconductor region.

6. The dynamic random access memory cell as claimed in claim 1, wherein said bit line, said active region and said word line take the form of a straight line.

7. A dynamic random access memory cell having a tunnel-shaped structure, comprising: a first conductivity-type semiconductor substrate; a field-oxide-layer formed on said semiconductor substrate in order to define an active region; first and second semiconductor regions of a second conductivity type formed within said active region; an insulating layer formed on a channel area between said first and said second semiconductor regions; a word line having side walls formed on said insulating layer; a word line capping-oxide-layer having an upper portion; a first spacer formed on the side walls of said word line and said word line capping-oxide-layer;

- a local connecting layer surrounding the upper portion of said word line capping-oxide-layer and said first spacer, and contacted through a contact to said first semiconductor region;
- a flattening insulating layer formed on said local connecting layer;
- a second spacer surrounding said flattening insulating layer, the side walls of said local connecting layer and said first spacer;
- a bit line and a bit line capping-oxide-layer formed on said flattening insulating layer;
- a third spacer formed on the side walls of said bit line, said bit line capping-oxide-layer; a lower plate electrode and a first capacitor dielectric layer are formed on the bit line capping-oxide-layer;
- a storage polysilicon formed on said first capacitor dielectric layer, the third spacer, and said flattening insulation layer;
- a second capacitor dielectric layer surrounding said storage polysilicon and the side walls of said local connecting layer; and
- an upper plate electrode formed upon said storage polysilicon.

8. The dynamic random access memory cell having a tunnel-shaped structure as claimed in claim 7, wherein said bit line and said lower plate electrode pass through a tunnel formed by said storage polysilicon and said local connecting layer.

9. The dynamic random access memory cell having a tunnel-shaped structure as claimed in claim 7, wherein said flattening insulating layer, said bit line capping-oxide-layer, said third spacer and said dielectric layer are filled between said storage polysilicon, said local connecting layer and said bit line.

* * * * *

UNITED STATES PATENT AND TRADEMARK OFFICE
CERTIFICATE OF CORRECTION

PATENT NO. : 5,262,663
DATED : November 16, 1993
INVENTOR(S) : Byunghyug Rho; Daeje Chin It is certified that error appears in the above-indentified patent and that said Letters Patent is hereby corrected as shown below:

Column 1, line 19, change "are" to -- area --.
Column 1, line 67, after "and" delete the comma.

Column 3, line 29, change "4B" to -- 14B --.
Column 3, line 41, change "region" to -- regions --.
Column 3, line 49, change "electrode" to
   -- electrodes --.

Column 4, line 50, after "field-oxide-layer"
   insert -- 1 --.

Column 5, line 13, after "layer" insert -- 11 --.
Column 5, line 18, change "bit line cap 5" to
   -- bit line capping oxide layer 5 --.

UNITED STATES PATENT AND TRADEMARK OFFICE
CERTIFICATE OF CORRECTION

PATENT NO. : 5,262,663
DATED : November 16, 1993
INVENTOR(S) : Byunghyug Rho; Daeje Chin It is certified that error appears in the above-indentified patent and that said Letters Patent is hereby corrected as shown below:

Column 6, line 8, after "bit" insert -- line and --.

Column 7, line 48, change "ad" to -- and --.

Signed and Sealed this

Twenty-seventh Day of December, 1994

Attest:

BRUCE LEHMAN

Attesting Officer  Commissioner of Patents and Trademarks